United States Patent
Spahr et al.

(10) Patent No.: US 10,305,107 B2
(45) Date of Patent: May 28, 2019

(54) SURFACE-MODIFIED LOW SURFACE AREA GRAPHITE, PROCESSES FOR MAKING IT, AND APPLICATIONS OF THE SAME

(71) Applicant: IMERYS GRAPHITE & CARBON SWITZERLAND LTD., Bodio (CH)

(72) Inventors: Michael E. Spahr, Bellinzona (CH); Pirmin A. Ulmann, Giubiasco (CH); Simone Zurcher, Bellinzona (CH); Michal Gulas, Malvaglia (CH); Flavio Mornaghini, Breganzona (CH)

(73) Assignee: Imerys Graphite & Carbon Switzerland Ltd., Bodio (CH)

( * ) Notice: Subject to any disclaimer, the term of this patent is extended or adjusted under 35 U.S.C. 154(b) by 1011 days.

(21) Appl. No.: 14/390,411

(22) PCT Filed: Mar. 15, 2013

(86) PCT No.: PCT/EP2013/055376
§ 371 (c)(1),
(2) Date: Oct. 3, 2014

(87) PCT Pub. No.: WO2013/149807
PCT Pub. Date: Oct. 10, 2013

(65) Prior Publication Data
US 2015/0079477 A1    Mar. 19, 2015

(30) Foreign Application Priority Data
Apr. 5, 2012    (EP) ...................................... 12163479

(51) Int. Cl.
*H01M 4/587* (2010.01)
*C23C 16/26* (2006.01)
(Continued)

(52) U.S. Cl.
CPC ............. *H01M 4/587* (2013.01); *C01B 32/21* (2017.08); *C23C 16/00* (2013.01); *C23C 16/26* (2013.01);
(Continued)

(58) Field of Classification Search
USPC ....................................... 427/249.6
See application file for complete search history.

(56) References Cited

U.S. PATENT DOCUMENTS

2007/0128518 A1* 6/2007 Uono ...................... C01B 31/04
                                                            429/231.4
2008/0274404 A1* 11/2008 Ishii ........................ C01B 31/04
                                                            429/217

(Continued)

FOREIGN PATENT DOCUMENTS

CN      1885598 A      12/2006
CN     101604750 A     12/2009
(Continued)

OTHER PUBLICATIONS

Baldan. "Raman validity for crystallite size La determination on reticulated vitreous carbon with different graphitization index". vol. 254. Issue 2. Nov. 15, 2007. pp. 600-603 (Year: 2007).*

(Continued)

*Primary Examiner* — Sarah A. Slifka
*Assistant Examiner* — Haroon S. Sheikh
(74) *Attorney, Agent, or Firm* — Finnegan, Henderson, Farabow, Garrett & Dunner LLP

(57) ABSTRACT

Surface-modified, low surface area synthetic graphite may have a BET surface from 1.0 to 4.0 m²/g and a crystallite size $L_c$ to crystallite size $L_a$ ratio of greater than 1. Processes for modifying the surface of low surface area synthetic graphite may result in surface-modified, low surface area synthetic graphite have a BET surface from 1.0 to 4.0 m²/g
(Continued)

and a crystallite size $L_c$ to crystallite size $L_a$ ratio of greater than 1. Such synthetic graphite may have many uses, including for example, as a negative electrode material in lithium-ion batteries.

17 Claims, 2 Drawing Sheets

(51) Int. Cl.
*C23C 16/56* (2006.01)
*C23C 16/00* (2006.01)
*C01B 32/21* (2017.01)

(52) U.S. Cl.
CPC ......... *C23C 16/56* (2013.01); *Y10T 428/2982* (2015.01)

(56) References Cited

U.S. PATENT DOCUMENTS

| | | | |
|---|---|---|---|
| 2010/0015514 A1* | 1/2010 | Miyagi | H01M 4/131 429/129 |
| 2013/0143127 A1 | 6/2013 | Nakamura et al. | |
| 2013/0260150 A1 | 10/2013 | Grivei et al. | |
| 2013/0337325 A1 | 12/2013 | Jung et al. | |
| 2014/0227588 A1 | 8/2014 | Kim et al. | |
| 2014/0234714 A1 | 8/2014 | Cho et al. | |
| 2014/0302394 A1 | 10/2014 | Yue et al. | |
| 2015/0079477 A1 | 3/2015 | Spahr et al. | |
| 2015/0099180 A1 | 4/2015 | Cericola et al. | |

FOREIGN PATENT DOCUMENTS

| | | |
|---|---|---|
| EP | 0782207 B1 | 12/1996 |
| EP | 1265301 B1 | 6/2002 |
| EP | 1361194 A1 | 11/2003 |
| EP | 1120842 B1 | 11/2005 |
| EP | 2650955 A1 | 10/2011 |
| EP | 2892093 A1 | 8/2013 |
| EP | 2827414 A1 | 1/2015 |
| GB | 1343365 | 1/1974 |
| JP | H 1012241 A | 1/1998 |
| JP | H 11176443 A | 7/1999 |
| JP | H 11176477 A | 7/1999 |
| JP | H 11204109 A | 7/1999 |
| JP | H 11269647 A | 10/1999 |
| JP | 2001202961 A | 7/2001 |
| JP | 2001283848 A | 10/2001 |
| JP | 2002-025619 | 1/2002 |
| JP | 2002-110158 A | 4/2002 |
| JP | 2002141062 A | 5/2002 |
| JP | 2004250275 A | 9/2004 |
| JP | 2004319312 A | 11/2004 |
| JP | 2005149946 A | 6/2005 |
| JP | 2005197096 A | 7/2005 |
| JP | 2009302671 A | 11/2005 |
| JP | 2007-305446 A | 11/2007 |
| JP | 2008-169513 A | 7/2008 |
| JP | 2010-275140 A | 12/2010 |
| KR | 101479320 B1 | 1/2015 |
| WO | WO 2010-049428 A2 | 5/2010 |
| WO | WO 2013-149807 A2 | 10/2013 |

OTHER PUBLICATIONS

Spahr, Michael E.; Palladino, Tiziana; Wilhelm, Henri; Würsig, Andreas; Goers, Dietrich; Buqa, Hilmi; Holzapfel, Michael; and Novák, Petr, "Exfoliation of Graphite during Electrochemical Lithium Insertion in Ethylene Carbonate-Containing Electrolytes", Journal of The Electrochemical Society, vol. 151, No. (9), 2004, pp. A1383-A1395.
Spahr, Michael E.; Buqa, Hilmi; Würsig, Andreas; Goers, Dietrich; Hardwick, Laurence; Novák, Petr; Krumeich, Frank; Dentzer, Joseph; and Vix-Guterl, Cathie, "Surface reactivity of graphite materials and their surface passivation during the first electrochemical lithium insertion", Journal of Power Sources, Elesevier, vol. 153, 2006, pp. 300-311.
Goers, D.; Buqa, H., Hardwick, L.; Würsig, A.; and Novák, P.; "Raman Spectroscopic and Structural Studies of Heat-Treated Graphites for Lithium-Ion Batteries", Ionics, vol. 9, No. 3-4, 2003, pp. 258-265—XP055043416.
Spahr, Michael E.; Wilhelm, Henri; Joho, Felix; Panitz, Jan-Christoph; Wambach, Jörg; Novák, Petr; and Dupont-Pavlovsky, Nicole; "Purely Hexagonal Graphite and the Influence of Surface Modifications on its Electrochemical Lithium Insertion Properties", Journal of the Electrochemical Society, vol. 149, No. 8, 2002, pp. A960-A966—XP008157749.
Rubino, Robert S.; Takeuchi, Esther Sans; "The study of irreversible capacity in lithium-ion anodes prepared with thermally oxidized graphite", Journal of Power Sources, Elsevier, vols. 81-82, 1999, pp. 373-377—XP004363181.
Liu, Shu-he; Ying, Zhe; Wang, Zuo-ming; Li, Feng; Bai, Shuo; Wen, Lei; and Cheng, Hui-ming; "Improving the electrochemical properties of natural graphite spheres by coating with a pyrolytic carbon shell", New Carbon Materials, vol. 23, No. 1, 2008, pp. 30-36— XP022937747.
Natarajan, C., Fujimoto, H., Tokumitsu, K. Mabuchi, A. and Kasuh, T., "Reduction of the irreversible capacity of a graphite anode by the CVD process", Carbon, Elsevier, vol. 39, No. 9, 2001, pp. 1409-1413—XP004319986.
International Search Report and Written Opinion dated Oct. 28, 2013, for International Application No. PCT/EP2013/055376.
Placke, T.; Siozios, V.; Schmitz, R.; Lux, S.F.; Bieker, P.; Colle, C.; Meyer, H.-W.; Passerini, S.; and Winter, M., "Influence of graphite surface modifications on the ratio of basal plane to "non-basal plane" surface area and on the anode performance in lithium ion batteries", Journal of Power Sources, vol. 200, 2012, pp. 83-91.
Contescu, Cristian I.; Azad, Samina; Miller, Doug; Lance, Michael J.; Baker, Frederick S., "Practical aspects for characterizing air oxidation of graphite", Journal of Nuclear Materials, vol. 381, 2008, pp. 15-24.
Park, Yoon-Soo; Bang, Hyun Joo; Oh, Seh-Min; Sun, Yang-Kook; and Lee, Sung-Man, "Effect of carbon coating on thermal stability of natural graphite spheres used as anode materials in lithium-ion batteries", Journal of Power Sources, vol. 190, 2009, pp. 553-557.
Ding, Yun-Shuang; Li, Wei-Na; Iaconetti, Santo; Shen, Xiong-Fei; DiCarlo, Joe; Galasso, Francis S.; and Suib, Steven L., "Characteristics of graphite anode modified by CVD carbon coating", Surface & Coatings Technology, vol. 200, 2006, pp. 3041-3048.
Guoping, Wang; Bolan, Zhang; Min, Yue; Xiaoluo, Xu; Meizheng, Qu; and Zuolong, Yu, "A modified graphite anode with high initial efficiency and excellent cycle life expectation", Solid State Ionics, vol. 176, 2005, pp. 905-909.
Kim, Kyungsoo; Zhu, Pengyu; Li, Na; Ma, Xiaoliang; Chen, Yongsheng; "Characterization of oxygen containing functional groups on carbon materials with oxygen K-edge X-ray absorption near edge structure spectroscopy"; Elsevier, Carbon, vol. 49, 2011; pp. 1745-1751.
Scherrer, P., "Bestimmung der Größe und der inneren Struktur von Kolloidteilchen mittels Röntgenstrahlen"; Nachrichten von der Gesellschaften der Wissenchaften zu Göttingen, Mathematisch-Physikalische; Göottingen; 1895, 1933; pp. 98-100.
Iwashita, Norio; Park, Chong Rae; Fujimoto, Hiroyuki; Shiraishi, Minoru; Inagaki, Michio; "Specification for a standard procedure of X-ray diffraction measurements on carbon materials"; Elsevier, Carbon, vol. 42, 2004; pp. 701-714.
Brunauer, Stephen; Emmett, P. H., and Teller, Edward, "Adsorption of Gases in Multimolecular Layers"; Journal of the American Chemical Society, vol. 60, 1938, pp. 309-319.
Dongll et al., "Surface chemical modifications induced on high surface area graphite and carbon nanofibers using different osidation and functionalization treatments," Journal of Colloid and Interface Science, Nov. 30, 2011, p. 179-189.
Menachem et al., "Characterization of lithiated natural graphite before and after mild oxidation," Journal of Power Sources, Oct. 4, 1998, p. 180-185.

(56) References Cited

OTHER PUBLICATIONS

Fu et al., "Surface modifications of electrode materials for lithium ion batteries," Solid State Sciences 8, Jan. 20, 2006 p. 113-128.
Jiang et al., "Thermal analysis of the oxidation of natural graphite—effect of particle size," Thermochimica Acta 351, Jan. 12, 2000, p. 85-93.
Placke et al., "Influence of graphite surface modifications on the ratio of basal plane to "non-basal plane" surface area and on the anode performance in lithium ion batteries," Journal of Power Sources 200, Oct. 28, 2011, p. 63-91.
Rubino et al., "The study of irreversible capacity in lithium-ion anodes prepared with thermally oxidized graphite," Journal of Power Sources, 1999, p. 373-377.
Spahr et al., "Surface reactivity of graphite materials and their surface passivation during the first electrochemical lithium insertion," Journal of Power Sources 153, Jun. 28, 2005, p. 300-311.
Spahr et al., Exfoliation of graphite during electrochemical lithium insertion in ethylene carbonate-containing electrolytes,: Journal of The Electrochemical Society 151, Aug. 11, 2004.
Spahr et al. "Purely Hexagonal Graphite and the Influence of Surface Modifications on its Electrochemical Lithium Insertion Properties," Journal of The Electrochemical Society 149, Jun. 12, 2002.
Zaghib et al., "Thermal analysis of the oxidation of natural graphite: isothermal kinetic studies," Thermochimica Acta 371, Dec. 2000, p. 57-64.
Zhao et al., "Modification of natural graphite for lithium ion batteries," Solid State Sciences 10, Oct. 35, 2007, p. 612-617.
Bammidipati et al., "Chemical vapor deposition of carbon on graphite by methane pyrolysis," AIChE Journal, 42(11):3123-3132, (1996).
Communication of Extended European Search Report for EP Application No. 17210404.4, dated Mar. 7, 2018.

\* cited by examiner

Figures 3a-c:
a)
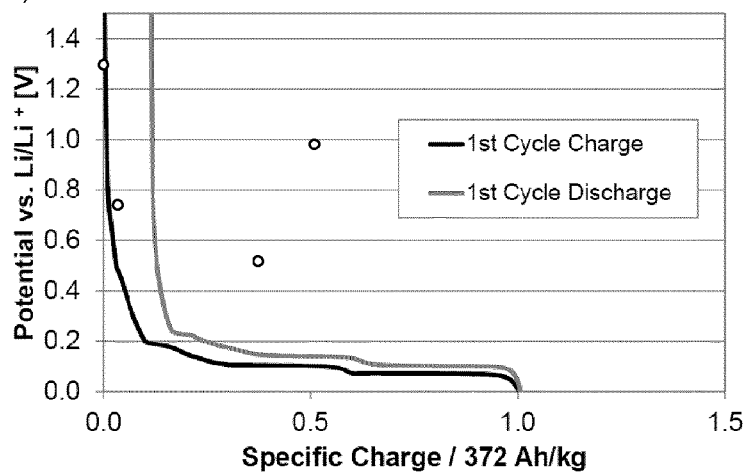
b)
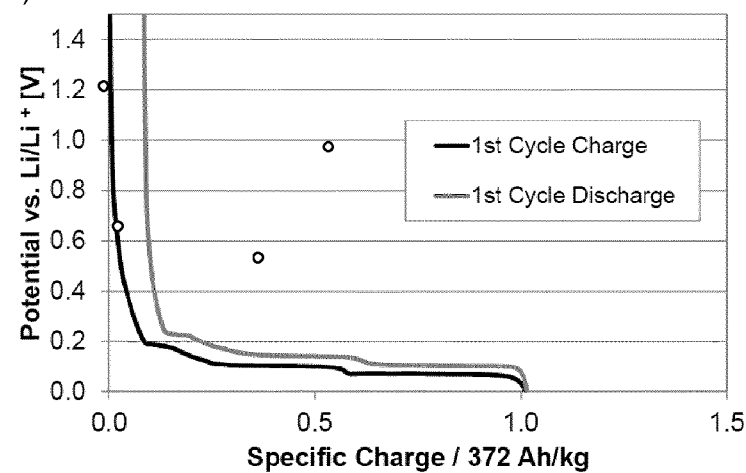
c)
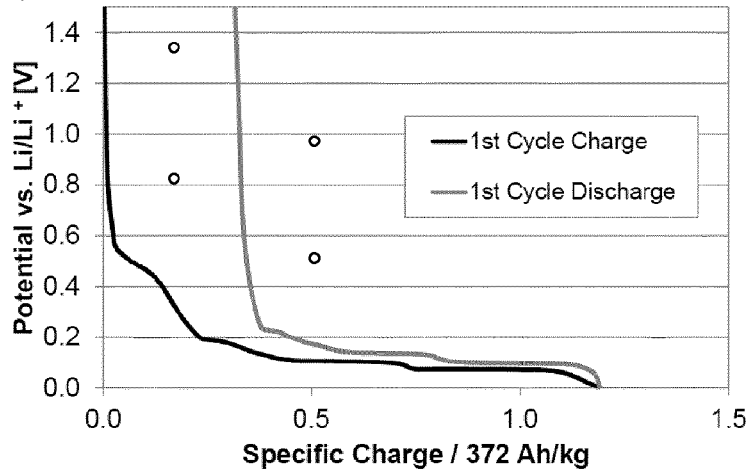

SURFACE-MODIFIED LOW SURFACE AREA GRAPHITE, PROCESSES FOR MAKING IT, AND APPLICATIONS OF THE SAME

CLAIM FOR PRIORITY

This application is a U.S. national phase entry under 35 U.S.C. § 371 from PCT International Application No. PCT/EP2013/055376, filed Mar. 15, 2013, which claims the benefit of priority of European Patent Application No. 12163479.4, filed Apr. 5, 2012, the subject matter of which is incorporated herein by reference.

FIELD OF THE DISCLOSURE

The present disclosure relates to surface-modified, low surface area, synthetic, graphite, to processes for preparing said graphite and to applications for said graphite material, particular as a negative electrode material in lithium-ion batteries.

BACKGROUND

Various graphitic materials are commonly employed as an active material for negative electrodes in lithium-ion batteries in view of their high negative redox potential, their high specific electrochemical capacity for lithium insertion, low first cycle capacity loss, and good cycle life. On the other hand, graphite generally exhibits only low volumetric density, a high sensitivity to electrolytes, and is furthermore prone to undesirable exfoliation.

Lithium-ion cells typically operate under conditions which lead to decomposition of the organic electrolytes, where the decomposition products form a protective film at the carbon-electrolyte interface. This protective film commonly referred to as solid electrolyte interphase (SEI) will ideally act as an electronically insulating layer, thereby preventing continued electrolyte decomposition while still allowing the transport of lithium ions. It is generally understood that the transport of lithium ions during charge/discharge cycles occurs on the prismatic rather than the basal plane surfaces of the graphite particles (see, for example, Placke et al., J. of Power Sources 200 (2012), pp. 83-91).

The SEI formation typically occurs in the first few charge/discharge cycles of the lithium ion cell operation, although it also affects the long-term cycle life. In any event, the SEI formation is connected with an irreversible consumption of lithium and electrolyte material, which in turn leads to an irreversible charge loss commonly referred to as "irreversible capacity" ($C_{irr}$).

Because the loss of lithium (and decomposition of electrolytes) reduces the specific capacity of the cell, attempts have been made to optimize the SEI layer formation in order to reduce the irreversible capacity while still forming an effective, but thin SEI. In general, it is believed that the SEI formation largely depends on the electrode surface morphology which is in contact with the electrolyte. Factors affecting the formation of the SEI include, amongst others, the type of binder and the porosity of the electrode. For negative electrodes wherein the active material is graphite, the type of graphite (e.g., particle size distribution, particle shape or morphology, surface area, functional groups on the surface, etc.) also appears to influence the SEI layer formation.

Surface-modified graphites have been described in the art, wherein the modification of the surface aimed at the optimization of the surface properties of the modified graphite during SEI layer formation in order to improve cycle life, reversible discharge capacity and irreversible capacity.

For example, the surface of natural or synthetic graphite has been modified by treatments contacting natural graphite with a concentrated sulfuric acid solution at high temperatures (210° C.), followed by coating with a resin and subsequent heat treatment for 3 h at 800° C. in a nitrogen atmosphere (Zhao et al., Solid State sciences 10 (2008), pp. 612-617, CN101604750). Others have described the heat treatment of potato shape graphite (TIMREX® SLP30) in oxygen atmosphere (Plancke et al., Journal of Power Sources, 200 (2012), pp. 83-91), or the treatment of synthetic graphite (LK-702 Nippon Carbon) in air atmosphere for very long residence times (6 to 56 h) (Rubino et al., Journal of Power Sources 81-82 (1999), pp. 373-377). TIMCAL published that oxidation of heat-treated ground graphite could suppress the exfoliation of graphite observed in ethylene carbonate based electrolyte systems (Journal of the Electrochemical Society, 149(8) (2002), A960-A966, Journal of The Electrochemical Society, 151(9) (2004), pp. A1383-A1395, Journal of Power Sources 153 (2006), pp. 300-311). Goers et al, Ionics 9 (2003), pp. 258-265 treated synthetic graphite (TIMREX® SLX 50) for 1 hour at various temperatures with air, observing an increase in the crystallite size $L_a$ (determined by Raman spectroscopy) after the oxidation treatment. Contescu et al. (Journal of Nuclear Materials 381 (2008), pp. 15-24) examined the effect of air flow rate on the properties of various surface-oxidized 3-dimensional graphite specimens (i.e. graphite bars) including a binder material, reporting inter alia that the intensity of the D band decreased compared to the G band after oxidation treatment, indicating an increase in the surface order of the treated graphite particles.

The prior art also reported on alternative surface modification treatments wherein graphite particles were coated with carbon by a technique called chemical vapor deposition (CVD). For example, Guoping et al., Solid State Ionics 176 (2005), pp. 905-909, describe the coating of milled spherical natural graphite by CVD at temperatures of between 900 and 1200° C. leading to improved initial coulombic efficiency and better cycle stability. Liu et al., New Carbon materials 23(1) (2008), pp. 30-36 likewise describe natural graphite materials modified by CVD (coating with acetylene gas at 1000° C.) with a disordered carbon structure (MNGs), which are said to exhibit improved electrochemical properties over natural graphite. Park et al., Journal of Power Sources 190 (2009), pp. 553-557, examined the thermal stability of CVD coated natural graphite when used as an anode material in lithium-ion batteries. The authors found that carbon coating of natural graphite by CVD led to a lower irreversible capacity and increased coulombic efficiency compared to unmodified natural graphite. Natarajan et al., Carbon 39 (2001), pp. 1409-1413, describe the CVD coating of synthetic graphite at temperatures between 700 and 1000° C. The authors report that a CVD coating at around 800° C. yielded the best results in terms of coulombic efficiency while showing a decreased disorder of the treated graphite particles (i.e. the intensity of the D band as determined by Raman spectroscopy decreases compared to the untreated material). Interestingly, the authors report that at 1000° C. the intensity of the D band increased, hinting at an increased disorder on the surface of the graphite particles at the higher temperature. Finally, Ding et al., Surface & Coatings Technology 200 (2006), pp. 3041-3048, likewise report on CVD coated graphite particles by contacting synthetic graphite with methane at 1000° C. Ding et al. conclude that the graphite particles coated by CVD for 30 minutes at 1000° C. exhibited improved electrochemical properties compared to untreated graphite material.

Overall, it appears that the results reported in the prior art remain somewhat inconclusive with regard to the desirable parameters of the surface-modified graphite particles as well as the process parameters for obtaining favorable surface-modified graphite materials exhibiting improved electrochemical properties. It is therefore an object of the invention to provide alternative surface-modification processes for synthetic graphitic carbons which yield surface-modified graphite materials having excellent physicochemical as well as electrochemical properties, especially when used as a material for negative electrodes in lithium-ion batteries. Thus, another related object of the present invention is to provide alternative surface-modified graphite materials generally having the aforementioned favorable physicochemical and electrochemical properties, particularly when used in lithium-ion batteries.

SUMMARY

The present inventors have found that by choosing appropriate graphitic carbon starting materials and carefully controlling the parameters of the surface modification process, it is possible to prepare surface-modified graphite having excellent properties, for example exhibiting an improved irreversible capacity, reversible discharge capacity or cycle life compared to the untreated material.

More specifically, the present inventors have developed surface-modification processes using low-surface area, synthetic graphitic carbons as a starting material by either chemical vapor deposition ("CVD coating") or by controlled oxidation at elevated temperatures, leading to graphite materials having improved surface properties, particularly during the initial lithium insertion step and the formation of the SEI layer.

Thus, in a first aspect of the present invention, low surface-area synthetic graphites are provided which are characterized by a BET surface area (BET SSA) ranging from about 1.0 to about 4 $m^2/g$, and by exhibiting a ratio of the perpendicular axis crystallite size $L_c$ (measured by XRD) to the parallel axis crystallite size $L_a$ (measured by Raman spectroscopy), i.e. $L_c/L_a$ of greater than 1.

Given that the surface-modified synthetic graphites of the present invention exhibit favorable electrochemical properties, another aspect of the present invention includes their use in preparing a negative electrode material in lithium-ion batteries. Since the retention of the specific charge of the negative electrode during subsequent charge/discharge cycles of the cell was found to be further improved by mixing a small amount, such as 1 to 30% by weight, of highly crystalline graphite of synthetic or natural origin with the surface-modified synthetic graphites of the present invention, such graphite compositions represent a further embodiment of the present invention.

Yet another, related aspect is thus the provision of negative electrodes of lithium-ion batteries which comprise the surface-modified graphite according to certain embodiments of the present invention, or the graphite compositions described above as an active material of the electrode.

Finally, lithium-ion batteries comprising said surface-modified synthetic graphite or said graphite compositions in the negative electrode of the battery are another aspect of the present invention.

Certain embodiments of the present invention not only provide the novel surface-modified synthetic graphites having excellent electrochemical properties, but also processes for obtaining said graphite materials. Accordingly, a further aspect is therefore the provision of a process for modifying the surface of low-surface-area synthetic graphite, wherein the process is characterized in that a synthetic graphite having a BET surface area ranging from about 1 to about 4 $m^2/g$ (preferably ranging from 1 to 3.5 or 3.0 $m^2/g$) is subjected to a surface modification that leads to an increase of the ratio between the crystallite size $L_c$ and the crystallite size $L_a$. In other words, the process lowers the crystallite size $L_a$ without substantially affecting the crystallite size $L_c$.

In one embodiment of this aspect of the present invention, the surface-modification of the low-surface-area synthetic graphite is achieved by contacting the untreated low-surface-area synthetic graphite with oxygen at elevated temperatures for a sufficient time to achieve an increase of the ratio $L_c/L_a$, preferably to a ratio of >1, or even greater, such as >1.5, 2.0, 2.5 or even 3.0. Moreover, the process parameters such as temperature, amount of oxygen-containing process gas and treatment time are chosen to keep the burn-off rate relatively low, preferably below about 10%, preferably below 9% or below 8%. The process parameters are further carefully selected so as to produce a surface-modified synthetic graphite maintaining a BET surface area of below about 4 $m^2/g$, and preferably below 3.5 or even 3.0 $m^2/g$ (e.g. ranging from 2.0 to 3.0 $m^2/g$).

In an alternative embodiment of this aspect of the present invention, the low-surface-area synthetic graphite starting material is subjected to a CVD coating treatment with hydrocarbon-containing process gas at elevated temperatures for a sufficient time to achieve an increase of the ratio $L_c/L_a$, preferably to a ratio of >1, or even greater, such as >1.5, 2.0, 2.5 or even 3.0.

Surface-modified low-surface-area synthetic graphites obtainable by the aforementioned surface-modification processes described herein are thus another aspect of the present invention.

BRIEF DESCRIPTION OF THE DRAWINGS

FIGS. 3a, 3b and 3c depict $1^{st}$ cycle plots of an electrochemical cell using treated material from Example 2 with irreversible capacity of 11.5% (top), CVD-treated material with irreversible capacity of 8.4% (middle), and raw graphite material with irreversible capacity 26.6% (bottom). Polyvinylidene-difluoride (PVDF) was used as a binder.

DETAILED DESCRIPTION OF THE INVENTION

Figure 1:
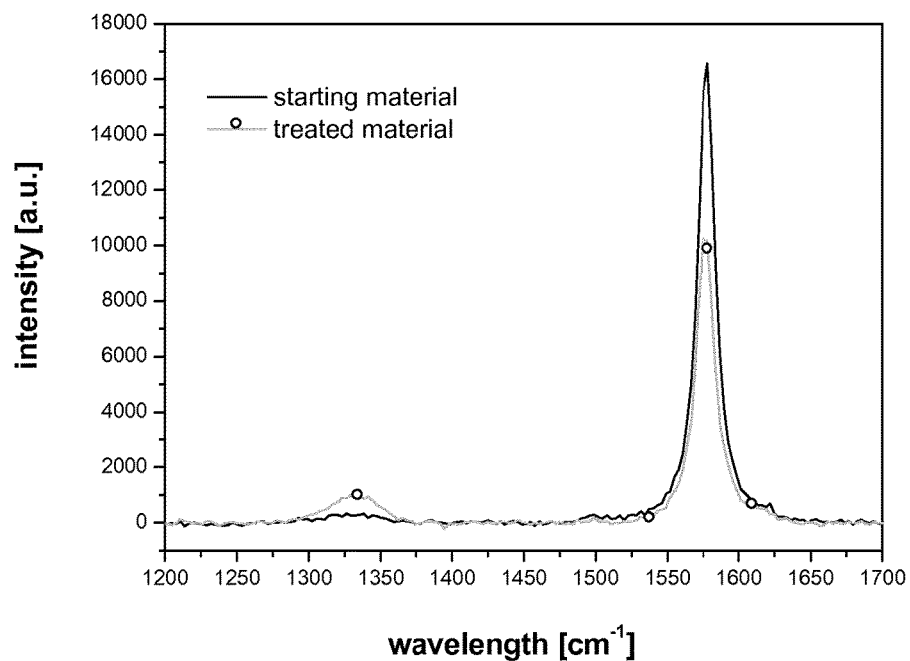
FIG. 1 shows a Raman spectrum of a low-surface area synthetic graphite starting material and of the material obtained after surface oxidation treatment according to Example 1. The crystallite size $L_a$ is calculated according to the ratio of $I_D$ and $I_G$ bands ($I_D/I_G$) at around 1330 $cm^{-1}$ and 1580 $cm^{-1}$, respectively.

Certain embodiments of the present invention provide novel low-surface-area synthetic graphites that can be obtained by surface-modification processes, such as mild oxidation treatment or CVD coating techniques, both of which are typically carried out at elevated temperatures, e.g. ranging from 500 to 1100° C. By carefully controlling the process parameters, the inventors have found that it is possible to favorably change the physicochemical properties and morphology of the obtained synthetic graphite through surface modification by either CVD or oxidation treatment.

Surface-Modified Low-Surface Area Synthetic Graphite

The resulting surface-modified synthetic graphite according to the present invention is inter alia characterized by a low BET surface area ranging from 1 to 4 $m^2/g$, although it is preferred that the resulting graphite has a BET surface area that does not exceed about 3.5 $m^2/g$, i.e. ranging from 1 to 3.5 $m^2/g$, or even lower, such as from 1 to 3.0 $m^2/g$, or from 1 to 2.5 $m^2/g$. Another characteristic of the surface-modified low-surface-area synthetic graphites according to certain embodiments of the present invention is the ratio of the crystallite size $L_c$ to the crystallite size $L_a$ ($L_c/L_a$) being greater than 1. In some embodiments, the ratio is even higher, for example more than 1.5, 2.0, 2.5 or even more than 3. Thus, certain embodiments of the synthetic graphites according to the invention are overall characterized by a low surface area combined with a particular morphology, including an increased proportion of prismatic surfaces and possibly a chemical modification of these surfaces through the contact with the process gas.

In certain embodiments, the crystallite size $L_c$ (as determined by XRD, for details see Measurement Methods section below) of the surface-modified synthetic graphite generally ranges from 50 to 200 nm, although it ranges in many cases from 80 to 180 nm. In some embodiments, the crystallite size $L_c$ may range from 100 to 130 nm. It will be appreciated that the surface-modification processes according certain embodiments of to the present invention will generally not have a significant influence on the crystallite size $L_c$ of the obtained material, i.e. the absolute value of $L_c$ depends mostly on the low-surface-area synthetic graphite starting material chosen for the surface modification. Many synthetic graphites, particularly those that are not ground prior to their surface modification exhibit a crystallite size $L_c$ ranging from 100 to 180 nm, although other starting materials with $L_c$ values outside of this range may likewise be useful as a starting material for certain embodiments of the present invention.

For some embodiments, the crystallite size $L_a$ (as determined by Raman spectroscopy, see Measurement Methods section below) of the treated graphite material generally ranges from 5 to 100 nm, although in many embodiments it will range from 5 to 60 nm, and sometimes even from 10 to 40 nm. Given that the ratio $L_c/L_a$ for certain embodiments of the graphites of the present invention generally is >1, it is clear that for synthetic graphites having a crystallite size $L_c$ in the lower allowed range (i.e. from 80 to 100 nm), the crystallite size $L_a$ would be lower than the respective crystallite size $L_c$ (even if the broadest range given above for $L_a$ would allow otherwise).

In certain embodiments, the surface-modified synthetic graphite exhibits an $I_D/I_G$ ratio ($R(I_D/I_G)$) of below 0.8, or below 0.6, 0.4, 0.3, 0.2 or even below 0.15 (determined by Raman spectroscopy when measured with a laser having an excitation wavelength of 632.8 nm). Given that the surface-modification processes increase the intensity of the D-band (i.e. an increase of the ratio of $I_D/I_G$) compared to the untreated material, it will be understood that in most embodiments, the $I_D/I_G$ ratio will be above 0.05, preferably above 0.07.

Since the surface area of graphite inter alia depends on the particle size of the graphite material, it will be understood that non-ground synthetic graphite is a particularly suitable starting material in certain embodiments of the processes of the present invention, particularly since the oxidation process generally leads to an increase in the BET surface area.

Accordingly, the surface-modified synthetic graphite of the present invention is in some embodiments further characterized by a particle size distribution with a $D_{90}$ ranging from 10 to 50 μm, although in certain embodiments, a $D_{90}$ value ranging from 15 to 40 nm, or from 20 to 35 μm is preferred. In some particular embodiments, the $D_{90}$ value will range from 25 to 30 μm. Likewise, the particle size distribution value $D_{50}$ will in some embodiments range from 5 to 40 μm, although in certain embodiments a $D_{50}$ value ranging from 7 to 30 μm, or from 10 to 20 μm is preferred. In some particular embodiments, the $D_{50}$ value will range from 10 to 15 μm. It will further be understood that the synthetic graphite may in these embodiments be further defined by each $D_{90}$ value range, independently or in addition to the $D_{50}$ value range (of course provided they are not mutually exclusive). Overall, the obtained surface treated synthetic graphite is in these embodiments characterized by a rather narrow particle size distribution, i.e. by relatively homogenous particle sizes.

For certain embodiments the surface-modified synthetic graphite of the present invention is further characterized by an oxygen content of greater than 50 ppm, while in certain of such embodiments the oxygen content may be greater than 60, 70, 80, 90, 100 or even 110 ppm. The inventors have observed that certain embodiments of the surface modification processes of the present invention generally lead to an increase of the oxygen content in the treated materials. Typical oxygen content values for the untreated synthetic graphite starting materials are therefore typically in the range of 40 to 80 ppm.

Other parameters that can be used to characterize the surface-treated graphite materials include Fe content and ash content as well as tapped and xylene density. Regarding the latter, it has been found that surface oxidation leads to an increase of the xylene density over the starting material, indicating etching of the less graphitized carbon (followed by production of CO and CO2) while the observed decrease of the xylene density in CVD treatments suggest deposition of pyrolytic carbon with lower xylene density.

Some embodiments of this aspect of the invention relate to surface-modified synthetic graphite characterized by a Fe content of below 20 ppm, and in some instances even below 15, 10 or 5 ppm. Likewise, in certain embodiments, the surface-modified synthetic graphite can exhibit an ash content of typically below 0.04, although often it will be below 0.02, 0.01%, or sometimes even below 0.005%.

The tapped density of the surface-modified synthetic graphite materials according to some embodiments will generally be greater than 0.8 $g/cm^3$, while in other embodiments, the tapped density will exceed 0.9 $g/cm^3$, 0.95 $g/cm^3$, or 1 $g/cm^3$.

Surface-Treated Synthetic Graphite Obtainable by Oxidation Treatment

Certain embodiments of the surface-modified synthetic graphite materials according to the present invention can be obtained by mild oxidation treatment by contacting untreated synthetic graphite with an oxygen-containing process gas for a limited time at elevated temperatures. The present inventors have found that surface-modified synthetic graphite with excellent electrochemical properties (particularly when used as negative electrode material in lithium-ion batteries) can be obtained by carefully selecting the starting material as well as adjusting the main process parameters, such as residence time, process gas flow rate and temperature in order to obtain modified graphites characterized by the parameters described herein.

Thus, in some embodiments the surface-modified synthetic graphite materials obtained by an oxidation treatment is characterized by a slightly acidic pH value ranging from about 5.0 to about 6.5. In certain embodiments, the pH of the synthetic graphites modified by mild oxidation ranges from 5.2 to 6, or from 5.3 to 5.5. Untreated synthetic graphite typically has a neutral pH (i.e. around pH 7), and the lower pH observed for surface-modified graphites by oxidation is believed to be due to the chemical modification of the graphite surface (which introduces carbonyl, carboxyl and hydroxyl groups primarily on the prismatic surfaces of the particles).

Surface-modified synthetic graphite materials obtainable by an oxidation treatment are in some embodiments further characterized by a xylene density ranging from 2.24 to 2.26 g/cm$^3$, although the xylene density will in certain cases range from 2.245 to 2.255 g/cm$^3$, or from 2.25 to 2.255 g/cm$^3$.

In certain embodiments, the surface-modified synthetic graphite materials are further characterized by an $I_D/I_G$ ratio ($R(I_D/I_G)$) of below about 0.3, or below about 0.25. In preferred embodiments of this aspect of the invention, $I_D/I_G$ ratio will be below about 0.2, or below about 0.15 when measured with a laser having excitation wavelength of 632.8 nm.

Generally speaking the surface-modified synthetic graphite materials characterized by the parameters given above are obtainable by contacting low-surface-area (e.g. non-ground) synthetic graphite with an oxygen-containing process gas at temperatures ranging from 500 and 1100° C. with treatment times that typically range from only 2 to 30 minutes, and in many cases from 2 to 15 minutes. In certain embodiments the treatment time required to obtain a modified graphite characterized by the aforementioned parameters will range from 5 to 12 minutes, e.g. when the process is carried out in a rotary furnace at temperatures from 700 to 900° C.

In preferred embodiments, advantageous surface-treated low-area synthetic graphite obtainable by an oxidation process as described herein may be characterized by the following parameters:
 i) a BET surface area ranging from 2.3 to 3 m$^2$/g
 ii) a crystallite size $L_c$ ranging from 100 to 180 nm
 iii) a crystallite size $L_a$ ranging from 10 to 40 nm
 iv) a pH value ranging from 5.2 to 6.0
 v) an oxygen content of greater than 90 ppm
 vi) a tapped density of greater than 0.98 g/cm$^3$
 vii) a particle size distribution ($D_{90}$) ranging from 25 to 35 µm.

It is readily apparent that the above exemplary ranges are not intended to be understood in a limited way. Thus, other ranges or values may be possible as long as the surface-modified synthetic graphite fulfills the basic structural requirements/parameters as set out above.

Surface-Treated Synthetic Graphite Obtainable by CVD Coating

The present inventors have found that the CVD coating technique is likewise suitable for generating surface-modified synthetic graphites having the advantageous electrochemical properties set out herein above. Hence, in some embodiments the surface-modified synthetic graphites are obtainable by CVD coating under carefully chosen reaction conditions giving synthetic graphite characterized by the parameters described herein.

More specifically, in some embodiments of this aspect of the invention, the surface-modified synthetic graphite obtainable by CVD coating is characterized by a BET surface area ranging from about 1 to about 2 m$^2$/g, and in some embodiments by a BET surface ranging from 1.0 to 1.5 m$^2$/g. Alternatively or in addition, such CVD coated surface-modified synthetic graphite can be characterized by a xylene density ranging from 2.1 to 2.26 g/cm$^3$. In certain of these embodiments, the xylene density ranges from 2.2 to 2.255 g/cm$^3$, and sometimes even from 2.24 to 2.25 g/cm$^3$.

In certain embodiments, the surface-modified synthetic graphite materials obtainable by CVD coating are further characterized by an $I_D/I_G$ ratio ($R(I_D/I_G)$) of below about 0.7, or below about 0.6 when measured with a laser having excitation wavelength of 632.8 nm.

Generally, CVD-coated low-surface-area synthetic graphite materials characterized by the parameters given are obtainable by contacting low-surface-area (e.g. non-ground) synthetic graphite by chemical vapor deposition at temperatures ranging from about 500 to about 1000° C. with a hydrocarbon-containing gas for treatment times ranging from 3 to 120 minutes in a suitable furnace.

In certain preferred embodiments of this aspect, advantageous surface-treated low-area synthetic graphite obtainable by CVD coating as described herein may be characterized by the following parameters:
 i) a BET surface area ranging from 1.3 to 1.8 g/cm$^3$
 ii) a crystallite size $L_c$ ranging from 100 to 160 nm
 iii) a crystallite size $L_a$ ranging from 20 and 60 nm, and, optionally,
 iv) an oxygen content of greater than 80 ppm.

It is again understood that the above exemplary ranges for CVD-coated synthetic graphite should not be understood in a limiting way. Other ranges or values may thus be possible as long as the surface-modified synthetic graphite fulfills the basic structural requirements/parameters as set out above.

Processes for Preparing Surface-Treated Synthetic Graphite

Another aspect of the present invention relates to a process for modifying the surface of low-surface area synthetic graphite to yield the surface-modified synthetic graphite materials with excellent electrochemical properties as described and claimed herein.

The process for the surface modification of synthetic graphite according to the present invention is characterized by the choice of a specific starting material, namely a low-surface-area synthetic graphite having a BET surface area ranging from 1 to 4 m$^2$/g, or from 1 to 3.5 m$^2$/g, or from 1 to 3.0 m$^2$/g. This starting material is subjected to a surface modification process selected from oxidation (contacting the graphite material with an oxygen-containing process gas) and chemical vapor deposition (contacting the graphite material with a hydrocarbon-containing process gas) at elevated temperatures and under conditions that increase the ratio between the crystallite size $L_c$ and the crystallite size $L_a$.

Preferably, the process parameters (temperature, process gas flow rate, residence/treatment time) are chosen so as to yield surface-modified synthetic graphite exhibiting a ratio of the crystallite size $L_c$ to the crystallite size $L_a$ of greater than 1, although in certain embodiments the ratio is larger than 1.5, 2.0, 2.5, or even 3.0. In other words, the crystallite size $L_a$ is reduced by the surface modification process while the crystallite size $L_c$ remains relatively unaffected.

With regard to the absolute values for the crystallite size $L_c$ and $L_a$ of the surface-modified synthetic graphites obtained from certain embodiments of the process of the invention, these can vary considerably depending on the starting material (particularly for $L_c$) and the process parameters chosen (in particular regarding $L_a$). For the crystallite size $L_c$, typical values for the obtained material in such embodiments range from 50 to 200 nm, or from 80 to 180 nm, or from 90 to 150 nm or from 100 to 130 nm. For the crystallite size $L_a$ of the surface-modified synthetic graphite, typical values in these embodiments range from 5 to 100 nm, or from 5 to 60 nm, or from 10 to 40 nm. In any case, the value for the crystallite size $L_a$ after the surface modification treatment is lower than before, i.e. compared to the untreated starting material, as explained above.

Generally speaking the oxygen content of the treated material is increased compared to the starting material. Thus, in some embodiments, the process leads to a material having an oxygen content of generally greater than 50 ppm, or greater than 70 ppm, 90 ppm, 100 ppm or even 110 ppm.

Likewise, the process can in certain embodiments be characterized by the tapped density of the obtained graphite material, which is typically greater than 0.8 g/cm$^3$, but in many cases will be greater than 0.9 g/cm$^3$, 0.95 g/cm$^3$, or 1 g/cm$^3$.

Another parameter that in some embodiments characterizes the surface-modified synthetic graphite obtained by certain embodiments of the process of the present invention is the Fe content, which is typically below 20 ppm, though in many cases will be below 15 ppm, 10 ppm, 7 ppm or even below 5 ppm. Yet another parameter that in some embodiments characterizes the surface-modified synthetic graphite obtained by the process of the present invention is the ash content of the surface-modified synthetic graphite, which may be below 0.04%, 0.02%, 0.01%, or in some cases even below 0.005%.

It will be understood that each of the above parameters and ranges for the obtained surface-modified synthetic graphite may characterize the process either alone or in combination.

With regard to the process parameters, the surface modification process of the present invention may in most embodiments be carried out at a temperature ranging from 500 to 1100° C., although in many of such embodiments the temperature will typically range from 600 to 1000° C., or from 700 to 900° C. In fact, as shown in the Example section, good results have been achieved at temperatures such as 700 or 900° C., respectively. In general, those of skill in the art will appreciate that the modification of the surface of the graphite particles is—at least for similar treatment times—more pronounced at higher temperatures. In other words, for comparable results the treatment time will have to be shorter if the process is carried out at higher temperatures. However, it may in some instances not be possible to reproduce the results at different temperatures even if the treatment time is appropriately adapted.

The surface-modification process according to certain embodiments of the present invention is typically carried out in a high temperature furnace like a rotary furnace, fluidized bed reactor or fixed bed reactor, although other reactor types are in general also possible. It has been found that satisfactory results can be achieved when the feeding rate of the synthetic graphite starting material ranges from 100 to 70000 g/h, or from 200 to 30000 g/h, or from 400 to 2000 g/h, though again, this value/range depends somewhat on the furnace type and dimensions and should therefore be understood as only giving a rough guidance.

If the process is carried out in a rotary furnace, it has been determined that good results can be achieved when said rotary furnace is operated at a rotational speed [rpm] of typically from 1 to 10, or in some embodiments from 3 to 9, or from 5 to 8 rpm. In these embodiments, it has further been determined that the inclination of the rotary furnace, which effectively determines the residence time of the particles in the furnace typically ranges from 0.5 to 10°, although in many cases the inclination of the rotary furnace will range from 3 to 9°, or even from 5 to 8°. Again, these values should be understood to illustrate the process parameters for a rotary furnace, giving a rough guidance to achieve the desired result (in this case residence time). In any event, those of skill in the art will understand how to adjust the process parameters such as temperature, choice and flow rate of process gas, and treatment time so as to arrive at a surface-modified synthetic graphite as defined hereinabove and in the appended claims.

Besides choosing the process parameters the result is of course also dependent on the properties of the synthetic graphite starting material. The process according to certain embodiments of the present invention allows the use of low-surface area synthetic graphite, which means that in many cases non-ground graphite can be subjected to the surface modification procedure described herein. Taking into account that the surface oxidation process generally increases the BET surface area of the treated material (in contrast to the CVD coating which typically leads to a decreased BET surface area after treatment), it is readily apparent that the BET surface area of the synthetic graphite starting material should not exceed or should even be somewhat lower than the upper limit for the BET surface area defined herein for the final surface-modified graphite material of certain embodiments of the present invention, i.e. lower than about 4 m$^2$/g, and preferably lower than 3.5 or 3.0 m$^2$/g, particularly for surface oxidation processes. In contrast, the BET surface for the synthetic graphite starting material subjected to a CVD coating process may be higher than the upper end of the allowed BET surface are for the finished product since the CVD coating will normally decrease the surface area of the treated material.

Many suitable low-surface-area synthetic graphites are commercially available and can be employed in certain embodiments of the processes of the invention. For example, an excellent synthetic graphite starting material is available under the trade name "Timrex® SLG3" from Timcal Graphite & Carbon (Bodio, CH), which is a non-ground synthetic graphite produced by a novel Acheson-type production process (described in WO 2010/049428 which is incorporated herein by reference in its entirety).

Processes for the Modification of Synthetic Graphite by Surface Oxidation

In some embodiments of this aspect of the invention, the process for modifying the surface of synthetic graphite involves a controlled oxidation of the graphite particles at elevated temperatures, such as ranging from about 500 to about 1100° C. The oxidation is achieved by contacting the low-area synthetic graphite particles with an oxygen-containing process gas for a relatively short time in a suitable furnace such as a rotary furnace mentioned above.

The process gas containing the oxygen may be selected from pure oxygen, (synthetic or natural) air, or other oxygen-containing gases such as $CO_2$, $CO$, $H_2O$ (steam), $O_3$, and $NO_x$. It will be understood that the process gas can also be any combination of the aforementioned oxygen-containing gases, optionally in a mixture with an inert carrier gas such as nitrogen or argon. It will generally be appreciated that the oxidation process runs faster with increased oxygen concentration, i.e., a higher partial pressure of oxygen in the process gas.

In many embodiments of this aspect of the present invention, the process parameters such as treatment time (i.e. residence time in the furnace), oxygen content and flow rate of the process gas as well as treatment temperature are chosen to keep the burn off rate below about 10% by weight, although it is in some embodiments desirable to keep the burn-off rate even lower, such as below 9%, 8%, 7%, 6% or 5%. The burn-off rate is a commonly used parameter, particularly in the context of surface oxidation treatments, since it gives an indication on how much of the carbonaceous material is converted to carbon dioxide thereby reducing the weight of the remaining surface-treated material.

The present inventors have found that for low-surface area synthetic graphite starting materials (i.e. having a BET surface area of below 4 or even 3.5 m$^2$/g) the treatment times during which the graphite particles are in contact with the oxygen-containing process gas (e.g. synthetic air) should be relatively short, thus in the range of 2 to 30 minutes. In many instances the time period may be even shorter such as 2 to 15 minutes, 4 to 10 minutes or 5 to 8 minutes. In fact, as can be seen from the working examples, good results have been achieved with treatment times of around 7 minutes at 700 and 900° C., although it is clear that such a value is meant to merely illustrate this aspect of the present invention. Indeed, employing different starting materials, temperatures and oxygen partial pressure may demand an adaptation of the treatment time in order to arrive at a surface modified synthetic graphite having the desired structural parameters as defined herein. Regardless of the above variability of the treatment time, it can be observed that the present surface modification process is relatively short compared to otherwise similar oxidation treatments described in the art (which are mostly in the (multiple) hour range).

In certain embodiments, the oxidation is achieved by contacting the synthetic graphite with air or another oxygen containing gas at a flow rate generally ranging from 1 to 200 l/min. It has been observed for particular embodiments that air flow rates from 1 to 50 l/min, or from 2 to 5 l/min give excellent results in terms of the electrochemical properties of the so-obtained graphite material. The skilled person will be able to adapt the flow rate depending on the identity of the process gas, the treatment temperature and the residence time in the furnace in order to arrive at a surface-modified graphite characterized by the parameters set out herein.

Processes for the Modification of Synthetic Graphite by Chemical Vapor Deposition In other embodiments of this aspect of the invention, the surface modification of the low-area synthetic graphite material can be achieved by chemical vapor deposition (CVD). In the case of carbon compounds such as graphite, the CVD process coats the surface of graphite particles with mostly disordered carbon-containing particles. CVD coating in the context of this embodiment of the invention involves thus contacting the synthetic graphite starting material with a process gas containing hydrocarbons or a lower alcohol for a certain time period at elevated temperatures (e.g. 500° to 1000° C.).

The treatment time will in most embodiments vary from 2 to 120 minutes, although in many instances the time during which the graphite particles are in contact with the process gas will only range from 5 to 90 minutes, from 10 to 60 minutes, or from 15 to 30 minutes. Suitable gas flow rates can be determined by those of skill in the art. In some embodiments, good results were obtained with a process gas containing 2 to 10% of acetylene or propane in a nitrogen carrier gas, and a flow rate of around 1 m$^3$/h.

The process gas in the CVD coating procedure may in some embodiments be selected from methane, ethane, ethylene (ethane), propane, propene, acetylene (propyne), butane, or combinations thereof, while in other embodiments, the process gas is an aromatic hydrocarbon vapor selected from benzene, toluene, or xylene, or in other embodiments an alcohol selected from ethanol, propanol, isopropanol, and combinations thereof. The hydrocarbon gas or alcohol vapor may also be mixed with an inert carrier gas such as nitrogen or argon.

In any event, as in the case of the oxidation treatment, the process may be carried out at the same temperatures and in the same equipment as already detailed above. The process parameters such as temperature, treatment time, and gas selection as well as flow rate can be adapted appropriately by those of skill in the art in view of the desired product characteristics and parameters of the surface-treated synthetic graphite material outlined above.

For example, a CVD coated synthetic graphite has been obtained in a fluidized bed reactor by contacting the starting material as described in Table 4 (obtained according to the process described in WO 2010/049428) below with an acetylene-containing process gas at a flow rate of 1 m$^3$/h for a period of 100 minutes at 800° C.

Overall, it will be appreciated that the parameters given for this example are not intended to limit the scope of protection, but rather serve to illustrate exemplary set-ups that provided surface-modified synthetic graphites falling under the scope of the claims, i.e. which are characterized by the parameters described herein.

Regarding the starting material, it has already been noted above that the CVD coating process generally leads to a decrease of the surface area, which means that the starting material must not necessarily exhibit a BET surface area of below about 4 m$^2$/g, although in many cases it will nevertheless be advantageous to employ non-ground graphite particles which frequently have a BET surface of below 4 m$^2$/g.

Having described the various processes for preparing a surface-modified synthetic graphite in greater detail, it is evident that another aspect of the present invention thus relates to surface-modified synthetic graphite obtainable by any of the foregoing processes and characterized by at least having a BET surface area from 1 to 4 m$^2$/g, preferably from 1 to 3.5 m$^2$/g and a crystallite size $L_c$ to crystallite ratio $L_a$ of greater than 1. The graphite obtainable by the processes described herein may optionally be further defined by any one of the additional parameters set out above and in the appended claims.

Overall, certain embodiments of the processes of the present invention may give rise to surface-modified synthetic graphite with improved electrochemical properties, i.e., the graphite provides for a higher discharge capacity and/or lower irreversible capacity compared to the untreated starting material when used as a negative electrode material in a lithium ion battery. Alternatively or in addition, the surface-treated graphite material obtained by the process may also improve the cycle life of the lithium ion battery.

In certain embodiments, the surface-oxidized low surface-area synthetic graphite appears to have increased hydrophilicity, which is, for example, advantageous for water-based electrode manufacturing processes (better wetting with aqueous medium and dispersion in aqueous medium).

Moreover, the surface treatment seems to result in an improved adhesion/cohesion of the surface-modified graphite, most likely due to the improved interaction of the oxidized graphite surface and the binder. Without wishing to be bound by any theory, the latter effect could be a factor for the observed excellent cycling stability and the electrode integrity during intercalation/deintercalation (cf. Example 4 below).

In certain embodiments, the peel strength of an electrode foil comprising the surface-modified low-surface-area synthetic graphite is greater than of an electrode foil comprising a low-surface-area synthetic graphite that is untreated. For instance, in certain embodiments an electrode foil comprising the surface-modified low-surface-area synthetic graphite and a CMC/SBR binder material prepared and measured as described above has a peel strength (as determined by the test method described herein) of more than 0.08 g cm$^{-1}$, representing a 20% improvement compared to the untreated material. Electrodes with improved peel strength of >0.08 g cm$^{-1}$ exhibited better cycling stability by about 65% as compared to untreated material.

Graphite Compositions Comprising the Surface-Modified Low-Surface-Area Synthetic Graphite and Highly Crystalline Synthetic Graphite It was found that mixing the surface-modified synthetic graphites described herein with finely ground synthetic or natural graphite may, when used as an active material in the negative electrode of lithium ion batteries, further improve the cycling stability of said electrodes.

Accordingly, another aspect of the present invention relates to graphite compositions comprising the surface-modified synthetic graphite as described herein and further comprising a finely ground highly crystalline synthetic graphite. As used herein, "highly crystalline" refers to the crystallinity of the graphite particles characterized by the interlayer distance c/2 and the real density characterized by the Xylene density as well as by the size of the crystalline domains in the particle characterized by the crystalline size $L_c$. In this sense highly crystalline graphite is a graphite with a c/2 of below 0.3370 nm, a Xylene density above 2.230 g cm$^{-3}$, and a $L_c$ of 20 nm and higher.

The highly crystalline graphite in such embodiments is typically characterized by a $D_{50}$ of about 1 to about 30 μm and a $D_{90}$ of about 2 to 80 μm, preferably a $D_{50}$ of about 2 to about 10 μm and a $D_{90}$ of about 4 to 50 μm by Malvern laser diffraction.

In certain embodiments of this aspect, the highly crystalline synthetic graphite is characterized by a $D_{90}$ of about 10 to about 25 μm, or preferably about 15 to about 20 μm and a $D_{50}$ of about 5 to about 15 μm, or preferably of about 7 to about 10 μm and a specific BET surface area of about 5 to about 15 m$^2$ g$^{-1}$ or more preferably of about 8 to about 12 m$^2$ g$^{-1}$, such as the commercially available graphite TIMREX® SFG 15 supplied by TIMCAL Ltd. In other embodiments of this aspect, the highly crystalline synthetic graphite is characterized by a $D_{90}$ of about 4 to about 10 μm, or preferably about 5 to about 7 μm and a $D_{50}$ of about 2 to about 6 μm, or preferably of about 3 to about 5 μm and a specific BET surface area of about 10 to about 25 m$^2$ g$^{-1}$ or more preferably of about 14 to about 20 m$^2$ g$^{-1}$, such as the product C-NERGY® SFG 6L supplied by TIMCAL Ltd.

The highly crystalline synthetic graphite is typically added in an amount of about 1 to about 30% by weight to the surface-modified low surface-area synthetic graphite, yielding graphite compositions having further improved properties in terms of cycling stability (e.g. the retention of the specific charge in the 1$^{st}$ discharge and the 10$^{th}$ discharge of the cell). In some preferred embodiments, the graphite compositions comprise 5 to 20% by weight, preferably 10 to 15% by weight of the highly crystalline synthetic graphite, although favourable effects have also been observed outside this preferred range.

Use of the Surface-Modified Low-Surface-Area Synthetic Graphite and Downstream Products Comprising Said Material Since the obtained surface-modified synthetic graphite materials as defined herein exhibit excellent electrochemical properties (especially compared to untreated material), yet another aspect of the present invention relates to the use of said surface-modified synthetic graphite, or said graphite compositions comprising the surface-treated graphite together with the highly crystalline synthetic graphite, as an active material for preparing negative electrodes for lithium ion batteries. Consequently, a negative electrode of a lithium ion battery which comprises the surface-modified synthetic graphite or graphite compositions as defined herein as an active material represents another aspect of the present invention. This includes electrodes where the negative electrodes comprise less than 100% of the graphite material according to the present invention as an active material. In other words, negative electrodes containing mixtures with yet other materials (graphite or otherwise) are likewise contemplated as an aspect of the present invention.

Finally, the present invention also relates to lithium ion batteries comprising the surface-modified synthetic graphite or graphite compositions as defined herein as the active material in the negative electrode of the lithium ion battery. Again, batteries wherein the negative electrodes contain mixtures with yet other graphite materials are also included in this aspect of the invention.

Measurement Methods

The percentage (%) values specified herein are by weight, unless specified otherwise.

Specific BET Surface Area

The method is based on the registration of the absorption isotherm of liquid nitrogen in the range p/p0=0.04-0.26, at 77 K. Following the procedure proposed by Brunauer, Emmet and Teller (Adsorption of Gases in Multimolecular Layers, J. Am. Chem. Soc., 1938, 60, 309-319), the monolayer capacity can be determined. On the basis of the cross-sectional area of the nitrogen molecule, the monolayer capacity and the weight of sample, the specific surface can then be calculated.

Crystallite Size $L_c$

Crystallite size $L_c$ is determined by analysis of the (002) and (004) diffraction profiles. For the present invention, the method suggested by Iwashita (N. Iwashita, C. Rae Park, H. Fujimoto, M. Shiraishi and M. Inagaki, Carbon 42, 701-714 (2004)) is used. The algorithm proposed by Iwashita has been specifically developed for carbon materials. The widths of the line profiles at the half maximum of sample and reference are measured. By means of a correction function, the width of pure diffraction profile can be determined. The crystallite size is subsequently calculated by applying Scherrer's equation (P. Scherrer, Göttinger-Nachrichten 2 (1918) p. 98).

Crystallite Size $L_a$

Crystallite size $L_a$ is calculated from Raman measurements (performed at external lab Evans Analytical Group) using equation:

$$L_a[\text{Angstrom (Å)}] = C \times (I_G/I_D)$$

where constant C has values 44[Å] and 58[Å] for lasers with wavelength of 514.5 nm and 632.8 nm, respectively.

Particle Size Distribution by Laser Diffraction

The presence of particles within a coherent light beam causes diffraction. The dimensions of the diffraction pattern are correlated with the particle size. A parallel beam from a low-power laser lights up a cell which contains the sample suspended in water. The beam leaving the cell is focused by an optical system. The distribution of the light energy in the focal plane of the system is then analyzed. The electrical signals provided by the optical detectors are transformed into particle size distribution by means of a calculator. A small sample of graphite is mixed with a few drops of wetting agent and a small amount of water. The sample prepared in the described manner is introduced in the storage vessel of the apparatus and measured.

References: ISO 13320-1/ISO 14887

Xylene Density

The analysis is based on the principle of liquid exclusion as defined in DIN 51 901. Approx. 2.5 g (accuracy 0.1 mg) of powder is weighed in a 25 ml pycnometer. Xylene is added under vacuum (15 Torr). After a few hours dwell time under normal pressure, the pycnometer is conditioned and weighed.

The density represents the ratio of mass and volume. The mass is given by the weight of the sample and the volume is calculated from the difference in weight of the xylene filled pycnometer with and without sample powder.

Reference: DIN 51 901

Scott Density (Apparent Density)

The Scott density is determined by passing the dry carbon powder through the Scott volumeter according to ASTM B 329-98 (2003). The powder is collected in a 1 in 3 vessel (corresponding to 16.39 cm$^3$) and weighed to 0.1 mg accuracy. The ratio of weight and volume corresponds to the Scott density. It is necessary to measure three times and calculate the average value. The bulk density of graphite is calculated from the weight of a 250 ml sample in a calibrated glass cylinder.

Tap Density 100 g of dry graphite powder is carefully poured into a graduated cylinder. Subsequently, the cylinder is fixed on the off-centre shaft-based tapping machine and 1500 strokes are run. The reading of the volume is taken and the tap density is calculated.

Reference: -DIN-ISO 787-11 pH Value:

1 g of graphite powder is dispersed in 50 ml of distilled water with 2 drops of Imbentin™ and measured by a pH-meter with a calibrated pH electrode.

Fe Content

This analysis is performed by an SDAR OES simultaneous emission spectrometer. Graphite powder, ground to a maximum particle size of 80 μm by means of a vibrated mill is compacted to a tablet. The sample is placed onto the excitation stand under argon atmosphere of the spectrometer. Subsequently the fully automatic analysis can be initiated.

Ash Content

A low-walled ceramic crucible is ignited at 800° C. in a muffle furnace and dried in a dessicator. A sample of 10 g of dry powder (accuracy 0.1 mg) is weighed in a low-walled ceramic crucible. The powder is combusted at a temperature of 815° C. (1472° F.) to constant weight (at least 8 h). The residue corresponds to the ash content. It is expressed as a percentage of the initial weight of the sample.

References: DIN 51903 and DIN 51701 (dividing process), ASTM C 561-91

Oxygen Content

Instrumental gas analysis method. Performed at external lab Evans Analytical Group.

Carbonyl, Carboxyl, Hydroxyl Group Content:

X-ray Absorption Near Edge Structure method. Performed at National Synchrotron Light Source (NSLS) at Brookhaven National Laboratory, by external contact [method reference: Kim, K.; Zhu, P.; Li, N.; Ma, X.; Chen, Y. *Carbon* 2011, 49, 1745].

Lithium-Ion Negative Electrode Half Cell Test—TIMCAL PVDF Standard Procedure

This test was used to qualify graphite active materials for their tendency to undergo exfoliation. For this purpose, electrodes with a relatively low density were prepared and an electrolyte without film-forming additives was used.

General Half Cell Parameters:

2 Electrode coin cell design with Li metal foil as counter/reference electrode, cell assembly in an argon filled glove box (oxygen and water content <1 ppm).

Diameter of electrodes: 13 mm

A calibrated spring (100 kN) was used in order to have a defined force on the electrode.

Tests were carried out at 25° C.

Dispersion formulation: 94% graphite (active material, 18.8 g), 6% PVDF (polyvinylidene fluoride) binder (9.23 g), 11 g N-methylpyrrolidine.

Dispersion preparation: The PVDF binder (13% solution in N-methylpyrrolidin), graphite and N-methylpyrrolidin were added to a Schott bottle, and stirred using a glass rod. A rotor-stator mixer was used to homogenize the solution for 5 minutes or longer at 11000 rpm.

Blading height on Cu foil: 200 μm (doctor blade).

Drying procedure: coated Cu foils were dried for 1 h at 80° C., followed by 12 h at 120° C. under vacuum (<50 mbar). After cutting, the electrodes were dried for 10 h at 120° C. under vacuum (<50 mbar) before insertion into the glove box.

Pressing: A 5×5 cm square of the electrode foils was pressed with 50-75 kN for 1 second in order to obtain electrode densities of 1.2-1.4 g/cm$^3$.

Electrolyte: Ethylenecarbonate(EC):Ethylmethylcarbonate (EMC) 1:3, 1 M LiPF$_6$

Separator: glass fiber sheet, ca. 1 mm

Cycling Program Using a Potentiostat:

1$^{st}$ charge: constant current step 10 mA/g to a potential of 5 mV vs. Li/Li$^+$, followed by a constant voltage step at 5 mV vs. Li/Li$^+$ until a cutoff current of 5 mA/g was reached. 1$^{st}$ discharge: constant current step 10 mA/g to a potential of 1.5 V vs. Li/Li$^+$, followed by a constant voltage step at 1.5 V vs. Li/Li$^+$ until a cutoff current of 5 mA/g was reached.

Further charge cycles: constant current step at 50 mA/g to a potential of 5 mV vs. Li/Li$^+$, followed by a constant voltage step at 5 mV vs. Li/Li$^+$ until a cutoff current of 5 mA/g was reached.

Further discharge cycles: constant current step at 3 C to a potential of 1.5 V vs. Li/Li$^+$, followed by constant voltage step at 1.5 V vs. Li/Li$^+$ until a cutoff current of 5 mA/g was reached.

Lithium-Ion Negative Electrode Half Cell Test—CMC/SBR Standard Procedure

This test was used to electrochemically qualify graphite active materials and mixtures of graphite active materials.

General Half Cell Parameters:

2 Electrode coin cell design with Li metal foil as counter/reference electrode, cell assembly in an argon filled glove box (oxygen and water content <1 ppm).

Diameter of electrodes: 13 mm.

A calibrated spring (100 kN) was used in order to have a defined force on the electrode.

Tests were carried out at 25° C.

Dispersion formulation: 97% graphite (active material, 48.5 g), 2% SBR (styrene butadiene rubber) binder (48 weight % in water, 2.08 g), 1% CMC (sodium carboxymethyl cellulose) binder (1.5 weight % in water, 33.3 g), 17 g water.

Dispersion preparation: A dispersion of the CMC binder solution and the graphite is prepared in a flask that can be put under vacuum, mixed with a glass rod until the graphite is fully wetted, then water is added. The mixture was stirred with a mechanical mixer (600 rpm) for 30 minutes under vacuum (<50 mbar). Vacuum was temporarily removed and SBR binder solution was added. The mixture was then stirred with a mechanical mixer (600 rpm) for another 30 min under vacuum (<50 mbar).

Blading height on Cu foil: 150 µm (doctor blade).

Drying procedure: coated Cu foils were dried for 1 h at 80° C., followed by 12 h at 120° C. under vacuum (<50 mbar). After cutting, the electrodes were dried for 10 h at 120° C. under vacuum (<50 mbar) before insertion into the glove box.

Pressing: 5×5 cm squares of the electrode foils were pressed with 75-400 kN for 1 second in order to obtain electrode densities of 1.45-1.55 g/cm$^3$.

Electrolyte A: Ethylenecarbonate (EC): Ethylmethylcarbonate (EMC) 1:3 (v/v), 1 M LiPF$_6$ Electrolyte B: Ethylenecarbonate (EC): Ethylmethylcarbonate (EMC) 1:3 (v/v), 0.5 volume % vinylene carbonate, 1 M LiPF$_6$ Separator: glass fiber sheet, ca. 1 mm Cycling program A using a potentiostat: 1$^{st}$ charge: constant current step 20 mA/g to a potential of 5 mV vs. Li/Li$^+$, followed by a constant voltage step at 5 mV vs. Li/Li$^+$ until a cutoff current of 5 mA/g was reached. 1$^{st}$ discharge: constant current step 20 mA/g to a potential of 1.5 V vs. Li/Li$^+$, followed by a constant voltage step at 1.5 V vs. Li/Li$^+$ until a cutoff current of 5 mA/g was reached. Further charge cycles: constant current step at 50 mA/g to a potential of 5 mV vs. Li/Li$^+$, followed by a constant voltage step at 5 mV vs. Li/Li$^+$ until a cutoff current of 5 mA/g was reached. Further discharge cycles: constant current step at 3 C to a potential of 1.5 V vs. Li/Li$^+$, followed by constant voltage step at 1.5 V vs. Li/Li$^+$ until a cutoff current of 5 mA/g was reached.

Cycling Program B Using a Potentiostat:

1$^{st}$ charge: constant current step 10 mA/g to a potential of 5 mV vs. Li/Li$^+$, followed by a constant voltage step at 5 mV vs. Li/Li$^+$ until a cutoff current of 5 mA/g was reached. 1$^{st}$ discharge: constant current step 10 mA/g to a potential of 1.5 V vs. Li/Li$^+$, followed by a constant voltage step at 1.5 V vs. Li/Li$^+$ until a cutoff current of 5 mA/g was reached. Further charge cycles: constant current step at 50 mA/g to a potential of 5 mV vs. Li/Li$^+$, followed by a constant voltage step at 5 mV vs. Li/Li$^+$ until a cutoff current of 5 mA/g was reached. Further discharge cycles: constant current step at 1 C to a potential of 1.5 V vs. Li/Li$^+$, followed by constant voltage step at 1.5 V vs. Li/Li$^+$ until a cutoff current of 5 mA/g was reached.

Calculation of 'per cycle capacity loss': the slope of a linear fit of the discharge capacities of cycles 5-15 is divided by the discharge capacity at cycle 5, resulting in a per cycle capacity loss value [%].

T-Peel Test

The peel resistance (of the active layers) was determined using a T-peel test.

Test specimen: 35.0×71.4 mm rectangles were cut from electrode foils and pressed with 14-16 kN/cm$^2$ for 1 second. Two specimens per electrode foil were tested. One electrode foil was made for each material.

Apparatus and procedure: tape was used to peel the active layer from the Cu current collector using a tension testing machine. The load was applied at a constant head speed of 100 mm/min. The maximum load on the specimen fell between 20 and 25% of the upper limit of the loading range of the used load cell. The peel resistance of each sample was determined over a distance of at least 40 mm and by averaging at least 640 readings. The average load (in Newton) was normalized by the length of the bondline (sample width in cm). Peel strength results are expressed in N/cm.

Having described the various aspects of the present invention in general terms, it will be apparent to those of skill in the art that many modifications and slight variations are possible without departing from the spirit and scope of the present invention.

The present invention is furthermore described by reference to the following numbered embodiments.

1. Surface-modified synthetic graphite having a BET surface area from about 1.0 to about 4 m$^2$/g, and exhibiting a ratio of the perpendicular axis crystallite size $L_c$ to the parallel axis crystallite size $L_a$ ($L_c/L_a$) of greater than 1.

2. The surface-modified synthetic graphite of embodiment 1, exhibiting an $I_D/I_G$ ratio ($R(I_D/I_G)$) of below 0.8 when measured with a laser having excitation wavelength of 632.8 nm.

3. The surface-modified synthetic graphite of embodiment 1 or embodiment 2, wherein the BET surface area ranges from 1 to 3.5 m$^2$/g, or from 1 to 3 m$^2$/g, and/or wherein said ratio of $L_c/L_a$ is greater than 1.5, 2.0, 2.5, or 3.0.

4. The surface-modified synthetic graphite of any one of embodiments 1 to 3, wherein the particle size distribution ($D_{90}$) ranges from 10 to 50 µm, or from 20 to 35 µm, or from 27 to 30 µm; and/or wherein the particle size distribution ($D_{50}$) ranges from 5 to 40 µm, or from 7 to 30 µm, or from 10 to 20 µm.

5. The surface-modified synthetic graphite of any one of embodiments 1 to 4, wherein the crystallite size $L_c$ ranges from 50 to 200 nm, or from 80 to 180 nm, or from 100 to 130 nm.

6. The surface-modified synthetic graphite of any one of embodiments 1 to 5, wherein the crystallite size $L_a$ ranges from 5 to 100 nm, from 5 to 60 nm, or from 10 to 40 nm.

7. The surface-modified synthetic graphite of any one of embodiments 1 to 6, wherein the oxygen content is greater than 50 ppm, or greater than 90 ppm, or greater than 110 ppm.

8. The surface-modified synthetic graphite of any one of embodiments 1 to 7, wherein the tapped density is greater than 0.8 g/cm$^3$, or greater than 0.9 g/cm$^3$, or greater than 0.95 g/cm$^3$, or greater than 1 g/cm$^3$.

9. The surface-modified synthetic graphite of any one of embodiments 1 to 8, wherein the Fe content value is below 20 ppm, or below 10 ppm, or below 5 ppm.

10. The surface-modified synthetic graphite of any one of embodiments 1 to 9, wherein the ash content is below 0.04, or below 0.01%, or preferably below 0.005%.

11. The surface-modified synthetic graphite of any one of embodiments 1 to 10, wherein the pH value ranges from 5.0 to 6.5, or from 5.2 to 6, or from 5.3 to 5.5.

12. The surface-modified synthetic graphite of embodiment 11, wherein the xylene density ranges from 2.24 to 2.26 g/cm$^3$, or from 2.245 to 2.255 g/cm$^3$, or from 2.25 and 2.255 g/cm$^3$.

13. The surface-modified synthetic graphite of embodiment 11 or embodiment 12, exhibiting an $I_D/I_G$ ratio ($R(I_D/I_G)$) of below about 0.3, or below about 0.25, or below about 0.2, or below about 0.15 when measured with a laser having excitation wavelength of 632.8 nm.

14. The surface-modified synthetic graphite of any one of embodiments 1 to 13, wherein the graphite is characterized by the following parameters:

i) a BET surface ranging from 2.3 to 3 m$^2$/g ii) a crystallite size $L_c$ ranging from 100 to 180 nm iii) a crystallite size $L_a$ ranging from 10 to 40 nm
iv) a pH value ranging from 5.2 to 6.0
v) an oxygen content of greater than 90 ppm
vi) a tapped density of greater than 0.98 g/cm$^3$
vii) a particle size distribution ($D_{90}$) ranging from 25 to 35 µm.

15. The surface-modified synthetic graphite of any one of embodiments 11 to 14, wherein the graphite is obtainable by oxidation of synthetic graphite with a BET surface area ranging from 1 m$^2$/g to about 3.5 m$^2$/g at temperatures from 500 to 1100° C. with treatment times ranging from 2 to 30 minutes, preferably wherein the synthetic graphite starting material is non-ground synthetic graphite.

16. The surface-modified synthetic graphite of any one of embodiments 1 to 10, wherein the BET surface area ranges from 1 and 2 m$^2$/g, or from 1.0 to 1.5 m$^2$/g.

17. The surface-modified synthetic graphite of embodiment 16, wherein the xylene density ranges from 2.1 to 2.26 g/cm$^3$, or from 2.2 to 2.255 g/cm$^3$, or from 2.24 to 2.25 g/cm$^3$.

18. The surface-modified synthetic graphite of any one of embodiments 16 to 18, wherein the surface-modified synthetic graphite is characterized by the following parameters:
   i) a BET surface area ranging from 1.3 to 1.8 g/cm$^3$
   ii) a crystallite size $L_c$ ranging from 100 to 160 nm
   iii) a crystallite size $L_a$ ranging from 20 to 60 nm; and, optionally
   iv) an oxygen content of greater than 80 ppm.

19. The surface-modified synthetic graphite of any one of embodiments 16 to 18, wherein said graphite is obtainable by chemical vapor deposition (CVD) on a synthetic graphite starting material at temperatures from 500 to 1000° C. with hydrocarbon gas and treatment times ranging from 3 to 120 minutes.

20. A process for modifying the surface of synthetic graphite, wherein a synthetic graphite having a BET surface area from 1 to 4 m$^2$/g, or from 1 to 3 m$^2$/g is subjected to a surface modification process selected from oxidation and chemical vapor deposition (CVD) under conditions that increase the ratio between the crystallite size $L_c$ and the crystallite size $L_a$.

21. The process of embodiment 20, wherein the surface of synthetic graphite is modified at a temperature ranging from 500 to 1100° C., or from 600 to 1000, or from 700 to 900° C.

22. The process of embodiment 20 or embodiment 21, wherein the surface of synthetic graphite is modified in a high temperature furnace, preferably wherein the furnace is a rotary furnace, a fluidized bed reactor or a fixed bed reactor.

23. The process of any one of embodiments 20 to 22, wherein the surface of said synthetic graphite is modified by contact with an oxygen-containing process gas, wherein the process parameters are adapted to keep the burn off rate (% w/w) below 10%, or below 9%, or below 8%.

24. The process of any one of embodiments 20 to 23, wherein the surface of said synthetic graphite is modified by contact with oxygen for a period ranging from 2 to 30 minutes, or from 2 to 15 minutes, or from 4 to 10 minutes, or from 5 to 8 minutes.

25. The process of embodiment 23 or embodiment 24, wherein the oxidation is achieved by contacting the synthetic graphite with air at a flow rate ranging from 1 to 200 l/min, or from 1 to 50 l/min, or from 2 to 5 l/min.

26. The process of any one of embodiments 20 to 22, wherein the surface of said synthetic graphite is modified by chemical vapor deposition achieved by contacting said graphite with a hydrocarbon gas or with alcohol vapor for a period ranging from 5 to 120 minutes, or from 10 to 60 minutes, or from 15 to 30 minutes.

27. The process of embodiment 26, wherein the hydrocarbon gas is an aliphatic or aromatic hydrocarbon selected from the group consisting of methane, ethane, ethylene, propane, propene, acetylene, butane, benzene, toluene, xylene and combinations thereof, or wherein the alcohol is selected from the group consisting of ethanol, propanol, isopropanol, and combinations thereof.

28. The process of embodiment 26 or embodiment 27, wherein the surface modification by chemical vapor deposition is carried out in a fluidized bed reactor at temperatures ranging from 500 to 1000° C. with hydrogen carbon gas mixed with an inert carrier gas, preferably wherein the hydrocarbon gas is acetylene or propane, and the carrier gas is nitrogen.

29. The process of any one of embodiments 20 to 28, wherein the surface-modified synthetic graphite exhibits a ratio of the crystallite size $L_c$ to the crystallite size $L_a$ ($L_c/L_a$) of greater than 1, or wherein said ratio is greater than 1.5, 2.0, 2.5, or 3.0.

30. The process of embodiment any one of embodiments 20 to 29, wherein the crystallite size $L_c$ of the surface-modified synthetic graphite ranges from 50 to 200 nm, or from 80 to 180 nm, or from 100 to 130 nm.

31. The process of any one of embodiments 20 to 30, wherein the crystallite size $L_a$ of the surface-modified synthetic graphite ranges from 5 to 100 nm, or from 5 to 60 nm, or from 10 to 40 nm.

32. The process of any one of embodiments 20 to 31, wherein the oxygen content of the surface-modified synthetic graphite is greater than 50 ppm, or greater than 90 ppm, or greater than 110 ppm.

33. The process of any one of embodiments 20 to 32, wherein the tapped density of the surface-modified synthetic graphite is greater than 0.8 g/cm$^3$, or greater than 0.9 g/cm$^3$, or greater than 0.95 g/cm$^3$, or greater than 1 g/cm$^3$.

34. The process of any one of embodiments 20 to 33, wherein the Fe content value of the surface-modified synthetic graphite is below 20 ppm, or below 10 ppm, or below 5 ppm.

35. The process of any one of embodiments 20 to 34, wherein the ash content of the surface-modified synthetic graphite is below 0.04, or below 0.01%, or below 0.005%.

36. The process of any one of embodiments 20 to 35, wherein the surface-modified synthetic graphite provides for a higher discharge capacity and/or lower irreversible capacity compared to the untreated starting material when used as a negative electrode material in a lithium ion battery.

37. A surface-modified synthetic graphite having a BET surface area from about 1.0 to about 4 m$^2$/g, and exhibiting a ratio of the perpendicular axis crystallite size $L_c$ to the parallel axis crystallite size $L_a$ ($L_c/L_a$) of greater than 1, obtainable by a process of any one of embodiments 20 to 36.

38. A graphite composition comprising the surface-modified synthetic graphite as defined in any one of embodiments 1 to 19 or 37 and further comprising 1 to 30% by weight of a highly crystalline synthetic or natural graphite.

39. The graphite composition of embodiment 38, wherein the highly crystalline graphite is a synthetic graphite characterized by
   i) a $D_{90}$ of about 15 to about 20 µm and a BET SSA of about 8 to about 12 m$^2$ g$^{-1}$; or
   ii) a $D_{90}$ of about 5 to about 7 µm and a BET SSA of about 14 to about 20 m$^2$ g$^{-1}$.

40. The graphite composition of embodiment 38 or 39, consisting of the surface-modified synthetic graphite as defined in any one of embodiments 1 to 19 or 37 and 5% to 20% by weight of said highly crystalline synthetic graphite.
41. Use of the surface-modified synthetic graphite as defined in any one of embodiments 1 to 19 or 37, or the graphite composition as defined in any one of embodiments 38 to 40, for preparing a negative electrode material for a lithium ion battery.
42. A negative electrode of a lithium ion battery comprising the surface-modified synthetic graphite as defined in any one of embodiments 1 to 19 or 37, or the graphite composition as defined in any one of embodiments 38 to 40, as an active material.
43. A lithium ion battery comprising the surface-modified synthetic graphite as defined in any one of embodiments 1 to 19 or 37, or the graphite composition as defined in any one of embodiments 38 to 40, in the negative electrode of the battery.

The following working examples further illustrate certain embodiments of the present disclosure.

EXAMPLES

Example 1—Surface Modification of Low Surface Area Synthetic Graphite by Oxidation The material to be treated, low surface area synthetic non-ground graphite, was continuously fed (400 g/h) into the rotary furnace heated at 700° C. in order to perform a relatively mild oxidation. Synthetic air (2 l/min) was used as a process gas and mixed with nitrogen (2 l/min) playing the role of a carrier gas. The inclination of the rotary furnace at 7.5° enabled the residence time of the graphite particles to be around 7 minutes. Rotation of the stainless steel rotary kiln with 7.5 rpm ensured homogeneity of the treatment. Using these conditions modified the product material comparing to starting material as shown in Table 1. While the BET increase points to changes of the microporosity and morphology of the graphite particles, the decrease of the pH value shows occurrence of new functionalized groups. The introduction of oxygen-containing groups apparently leads to a less hydrophobic and less inert surface of the treated graphite, as indicated by a change in hydrophobicity values (data not shown).

TABLE 1

Properties of starting material and material after treatment according to Example 1

|  | Starting material | Surface oxidation |
|---|---|---|
| BET [m²/g] | 1.8 | 2.15 |
| $L_c$ [nm] | 175 | 165 |
| $L_a$ [nm] | 170 | 34 |
| Xylene density [g/cm³] | 2.252 | 2.257 |
| Tapped density [g/cm³] | 0.96 | 0.86 |
| Scott density [g/cm³] | 0.45 | 0.35 |
| pH | 6.7 | 5.3 |
| $D_{10}$ | 5.8 | 6.2 |
| $D_{50}$ | 13.4 | 13.8 |
| $D_{90}$ | 28.9 | 28.9 |

The Raman spectra in FIG. 1 demonstrate a clear increase of band D in the treated material at around 1330 cm⁻¹, which arises from vibrational disorder-induced mode. This is believed to be due to the existence of defects in graphite hexagonal layers, sp³-hybridization as well as amorphous carbon occurrence. Similarly, the G-band peak at around 1580 cm⁻¹ corresponds to the Raman mode of graphite, which has been shown to be related to the fraction of sp²-bonded sites. As apparent from the spectra, the intensity of the G-band clearly decreases after oxidation treatment. A change of the $I_D/I_G$ ratio confirms the creation of defects and the shrinking of the crystalline domains ($L_a$) in graphite because of etching with oxygen atoms. The creation of functional groups, e.g. carboxylic acid, carbonyl, hydroxyl and/or ether groups, modifies the hybridization of the surface carbon atoms towards greater sp$^a$ character, thereby increasing the number of defects (Dongil et al., Journal of Colloid and Interface Science, 2011, 355, 179-189).

Oxidation treated graphite showed suppressed exfoliation in 1 M LiPF6, EC/EMC 1:3 (vol %) of electrodes containing said graphite and 6% PVDF (as a binder), which in turn leads to lower charge losses (shown in FIG. 3). In addition, the oxidation significantly increased the performance of the electrode at high current drain.

Figure 2:
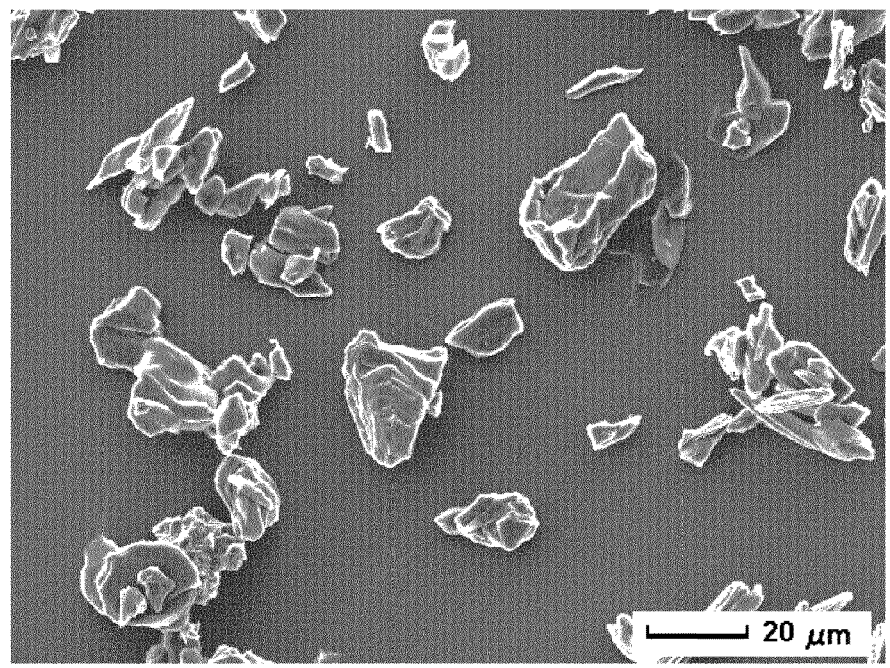
FIG. 2 shows an SEM image of surface treated graphite according to Example 2.

Example 2—Surface Modification of Low Surface Area Synthetic Graphite by Oxidation The same treatment conditions as in Example 1 were applied. However, the treatment temperature was increased to 900° C. in order to perform a more aggressive oxidation, which results in a bigger increase of the BET surface area (cf. Table 2 below). A scanning electron microscope image of the treated material is shown in FIG. 2.

TABLE 2

Properties of the starting and treated material according to Example 2

|  | Starting Material | Surface Oxidation |
|---|---|---|
| BET [m²/g] | 1.6 | 2.8 |
| $L_c$ [nm] | 110 | 110 |
| $L_a$ [nm] | 40 | 15 |
| Fe content [ppm] | 3.2 | 4.8 |
| Xylene density [g/cm³] | 2.251 | 2.252 |
| Tapped density [g/cm³] | 1.11 | 1 |
| Scott density [g/cm³] | 0.45 | 0.4 |

Example 3—Surface Modification of Low Surface Area Synthetic Graphite by Oxidation Surface oxidation was performed again in the above mentioned rotary furnace at 700° C., however without feeding the gas into the reactor. Only air was used as a process gas which was fed into the open furnace without any external forces. The inclination was set to 3°, in order to increase the residence time to 11 minutes to reach different oxidation conditions. With longer residence time and higher amount of the process gas the oxidation is more efficient while working at the same temperature compared to Example 1.

TABLE 3

Properties of the starting and treated material according to Example 3

|  | Starting Material | Surface Oxidation |
|---|---|---|
| BET [m²/g] | 1.95 | 2.45 |
| Xylene density [g/cm³] | 2.246 | 2.249 |
| Tapped density [g/cm³] | 1.02 | 1.04 |

TABLE 3-continued

Properties of the starting and treated material according to Example 3

|  | Starting Material | Surface Oxidation |
|---|---|---|
| Scott density [g/cm$^3$] | 0.44 | 0.43 |
| pH | 6.8 | 5.4 |

Examples 1, 2 and 3 illustrate how to modify the surface of non-grounded low surface area synthetic graphite in order to reach better electrolyte compatibility, lower irreversible capacity and higher discharge capacity (FIGS. 3a, 3b, and 3c) when used as an active material in lithium ion rechargeable batteries.

A summary of the physicochemical parameters of starting materials used and surface-modified graphite materials obtained in the working examples described herein is shown in Table 4 below.

TABLE 4

Parameters of starting and treated materials:

|  | Starting Material | Surface Oxidation | CVD Coating |
|---|---|---|---|
| BET [m$^2$/g] | 1.6-2.0 | 2.0-3.0 | 1.4-1.7 |
| L$_c$ [nm] | 100-180 | 100-180 | 80-160 |
| Fe content [ppm] | <20 | <20 | <20 |
| Carbonyl type groups [%] | 20 | 20-40 | 40 |
| Carboxyl type groups [%] | 61 | 70-50 | 40 |
| Hydroxyl type groups [%] | 19 | 10 | 20 |
| pH | 7 | 5.3 |  |
| Oxygen content [ppm] | 50-80 | 90-140 | 110 |

Example 4—Peel Strength and Per Cycle Capacity Loss of Surface-Modified Low Surface Area Synthetic Graphite by Oxidation and of Untreated Material Surface oxidation was performed as described in Example 3. The treated material as well as the untreated starting material were subjected to a peel strength test as described in the methods section above. The results of this test are shown in Table 5 below. In short, the surface-oxidized material exhibits significantly improved cohesion properties as indicated by an increased peel strength compared to untreated material. Both materials were also compared with regard to their capacity loss per cycle using the CMC/SBR standard procedure described in the method section above (electrolyte A, cycling program A, 3 C discharge rate). The surface-treated material again showed significantly improved properties over the untreated material as the per cycle capacity loss was significantly reduced compared to the untreated reference material (see again Table 5) for detailed results).

TABLE 5

Peel Strength and Per Cycle Capacity Loss of starting and treated materials:

|  | Without surface oxidation treatment | With surface oxidation treatment |
|---|---|---|
| Peel strength [N cm$^{-1}$] | 0.066 ± 0.002 | 0.080 ± 0.003 |
| Per cycle capacity loss [%] | 0.317 ± 0.017 | 0.192 ± 0.002 |

The surface-oxidized low surface area synthetic graphite was also mixed with varying amounts (5% to 20%) of highly crystalline synthetic graphite (particle size distribution $D_{10}$=4 μm, D50=9 μm, $D_{90}$=18 μm, BET SSA=9.5 m$^2$ g$^{-1}$, $L_c$=180 nm, c/2=0.3355 nm, Xylene density=2.260 g cm$^{-3}$ (TIMREX® SFG 15) and the physical and electrochemical properties of the mixtures compared to the pure treated material. The mixtures and pure treated material were tested for the retention of the specific charge per cycle, 1$^{st}$ discharge cycle specific charge, 5$^{th}$ discharge cycle specific charge (CMC/SBR standard procedure, electrolyte B, cycling program B, 1 C discharge rate).

In addition the tap density of the surface-treated material and the BET surface area of the graphite as well as the graphite mixtures was determined. A summary of the results is shown in Table 6 below. The addition of as little as 5% of highly crystalline synthetic graphite to the surface-treated low surface-area synthetic graphite appears to lead to further improvements in terms of per cycle capacity loss, 1$^{st}$ cycle irreversible capacity, and 5$^{th}$ cycle discharge capacity.

TABLE 6

Per Cycle Capacity Loss of Mixtures of Surface-Oxidized Low Surface-Area Synthetic Graphite with Highly Crystalline Synthetic Graphite

|  | Surface-oxidized low surface-area synthetic graphite without additives | Surface-oxidized low surface-area synthetic graphite with 5% highly crystalline synthetic graphite | Surface-oxidized low surface-area synthetic graphite with 10% highly crystalline synthetic graphite | Surface-oxidized low surface-area synthetic graphite with 20% highly crystalline synthetic graphite |
|---|---|---|---|---|
| Per cycle capacity loss [%] | 0.102 ± 0.002 | 0.034 ± 0.004 | 0.036 ± 0.004 | 0.020 ± 0.003 |
| 1st cycle irreversible capacity [%] | 8.7 ± 3.6 | 11.7 ± 2.8 | 11.5 ± 3.1 | 16.6 ± 2.9 |
| 5$^{th}$ cycle discharge capacity [Ah/kg] | 338.1 ± 2.9 | 345.6 ± 2.7 | 343.1 ± 2.1 | 348.7 ± 3.0 |
| Tap density of graphite | 0.96 g/cm$^3$ | not measured | not measured | 0.50 g/cm$^3$ |
| BET surface area of graphite [m$^2$/g] | 2.0-3.5 | 2.3-3.9 | 2.7-4.1 | 3.3-4.7 |

The invention claimed is:

1. Surface-modified synthetic graphite, wherein the surface-modified synthetic graphite:
   has a BET surface area from about 1.0 to about 4 m²/g;
   has a crystallite size $L_c$ (as measured by XRD) from 50 to 200 nm;
   has a crystallite size $L_a$ (as measured by Raman spectroscopy) from 5 to 100 nm; and
   exhibits a ratio ($L_c/L_a$) of the perpendicular axis crystallite size $L_c$ (measured by XRD) to the parallel axis crystallite size $L_a$ (measured by Raman spectroscopy) of greater than 1.5.

2. The surface-modified synthetic graphite of claim 1, further characterized by at least one of the following characteristics:
   i) a BET surface area ranging from 1 to 3.5 m²/g;
   ii) an ash content of below 0.04%;
   iii) a particle size distribution (D90) ranging from 10 to 50 μm;
   iv) a particle size distribution (D50) ranging from 5 to 40 μm;
   v) an Fe content of below 20 ppm;
   vi) an oxygen content of greater than 50 ppm; and
   vii) a tapped density of greater than 0.8 g/cm³.

3. The surface-modified synthetic graphite of claim 1, further characterized by at least one of the following characteristics:
   i) a pH value ranging from 5.0 to 6.5;
   ii) a xylene density from 2.24 to 2.26 g/cm³; and
   iii) exhibiting an ID/IG ratio (R(ID/IG)) of below about 0.3 when measured with a laser having excitation wavelength of 632.8 nm.

4. The surface-modified synthetic graphite of claim 3, characterized by the following characteristics:
   i) a BET surface ranging from 2.3 to 3 m²/g;
   ii) a crystallite size $L_c$ ranging from 100 to 180 nm;
   iii) a crystallite size $L_a$ ranging from 10 to 40 nm;
   iv) a pH value ranging from 5.2 to 6.0;
   v) an oxygen content of greater than 90 ppm;
   vi) a tapped density of greater than 0.98 g/cm³; and
   vii) a particle size distribution (D90) ranging from 25 to 35 μm.

5. The surface-modified synthetic graphite of claim 3, wherein the graphite is obtainable by oxidation of synthetic graphite with a BET surface area ranging from 1 m²/g to about 3.5 m²/g at temperatures from 500 to 1100° C. with treatment times ranging from 2 to 30 minutes.

6. Surface-modified synthetic graphite, wherein the surface-modified synthetic graphite:
   has a BET surface area from about 1.0 to about 4 m²/g;
   has a crystallite size $L_c$ (as measured by XRD) from 50 to 200 nm;
   has a crystallite size $L_a$ (as measured by Raman spectroscopy) from 5 to 100 nm;
   exhibits a ratio ($L_c/L_a$) of the perpendicular axis crystallite size $L_c$ (measured by XRD) to the parallel axis crystallite size $L_a$ (measured by Raman spectroscopy) of greater than 1.5; and
   has an oxygen content of greater than 50 ppm.

7. The surface-modified synthetic graphite of claim 6, further characterized by at least one of the following characteristics:
   i) a pH value ranging from 5.0 to 6.5;
   ii) a xylene density from 2.24 to 2.26 g/cm³; and
   iii) exhibiting an ID/IG ratio (R(ID/IG)) of below about 0.3 when measured with a laser having excitation wavelength of 632.8 nm.

8. The surface-modified synthetic graphite of claim 6, characterized by the following characteristics:
   i) a BET surface ranging from 2.3 to 3 m²/g;
   ii) a crystallite size $L_c$ ranging from 100 to 180 nm;
   iii) a crystallite size $L_a$ ranging from 10 to 40 nm;
   iv) a pH value ranging from 5.2 to 6.0;
   v) an oxygen content of greater than 90 ppm;
   vi) a tapped density of greater than 0.98 g/cm³; and
   vii) a particle size distribution (D90) ranging from 25 to 35 μm.

9. The surface-modified synthetic graphite of claim 6, further characterized by at least one of the following characteristics:
   i) a BET surface area ranging from 1 and 2 m²/g; and
   ii) a xylene density ranging from 2.1 to 2.26 g/cm³.

10. The surface-modified synthetic graphite of claim 6, wherein the surface-modified synthetic graphite is characterized by the following characteristics:
    i) a BET surface area ranging from 1.3 to 1.8 g/cm³;
    ii) a crystallite size $L_c$ ranging from 100 to 160 nm; and
    iii) a crystallite size $L_a$ ranging from 20 to 60 nm.

11. The surface-modified synthetic graphite of claim 6, wherein said graphite is obtainable by chemical vapor deposition (CVD) on a synthetic graphite starting material at temperatures from 500 to 1000° C. with hydrocarbon gas and treatment times ranging from 3 to 120 minutes.

12. Surface-modified synthetic graphite, wherein the surface-modified synthetic graphite:
    has a BET surface area from about 1.0 to about 4 m²/g;
    has a crystallite size $L_c$ (as measured by XRD) from 50 to 200 nm;
    has a crystallite size $L_a$ (as measured by Raman spectroscopy) from 5 to 100 nm;
    exhibits a ratio ($L_c/L_a$) of the perpendicular axis crystallite size $L_c$ (measured by XRD) to the parallel axis crystallite size $L_a$ (measured by Raman spectroscopy) of greater than 1.5; and
    has a particle size distribution (D50) ranging from 5 to 40 μm.

13. The surface-modified synthetic graphite of claim 12, further characterized by at least one of the following characteristics:
    i) a pH value ranging from 5.0 to 6.5;
    ii) a xylene density from 2.24 to 2.26 g/cm³; and
    iii) exhibiting an ID/IG ratio (R(ID/IG)) of below about 0.3 when measured with a laser having excitation wavelength of 632.8 nm.

14. The surface-modified synthetic graphite of claim 12, characterized by the following characteristics:
    i) a BET surface ranging from 2.3 to 3 m²/g;
    ii) a crystallite size $L_c$ ranging from 100 to 180 nm;
    iii) a crystallite size $L_a$ ranging from 10 to 40 nm;
    iv) a pH value ranging from 5.2 to 6.0;
    v) an oxygen content of greater than 90 ppm;
    vi) a tapped density of greater than 0.98 g/cm³; and
    vii) a particle size distribution (D90) ranging from 25 to 35 μm.

15. The surface-modified synthetic graphite of claim 12, further characterized by at least one of the following characteristics:
    i) a BET surface area ranging from 1 and 2 m²/g; and
    ii) a xylene density ranging from 2.1 to 2.26 g/cm³.

16. The surface-modified synthetic graphite of claim 12, wherein the surface-modified synthetic graphite is characterized by the following characteristics:
    i) a BET surface area ranging from 1.3 to 1.8 g/cm³;
    ii) a crystallite size $L_c$ ranging from 100 to 160 nm; and
    iii) a crystallite size $L_a$ ranging from 20 to 60 nm.

17. The surface-modified synthetic graphite of claim 12, wherein said graphite is obtainable by chemical vapor deposition (CVD) on a synthetic graphite starting material at temperatures from 500 to 1000° C. with hydrocarbon gas and treatment times ranging from 3 to 120 minutes.

\* \* \* \* \*